United States Patent [19]

Yoshikawa et al.

[11] Patent Number: 5,264,048
[45] Date of Patent: Nov. 23, 1993

[54] PHOTOELECTRIC CONVERSION DEVICE

[75] Inventors: Masao Yoshikawa; Tetsuro Suzuki, both of Yokohama, Japan

[73] Assignee: Ricoh Company, Ltd., Tokyo, Japan

[21] Appl. No.: 830,916

[22] Filed: Feb. 4, 1992

[30] Foreign Application Priority Data

Feb. 4, 1991 [JP] Japan .................................. 3-033346

[51] Int. Cl.⁵ .................. H01L 31/072; H01L 31/0344
[52] U.S. Cl. ...................................... 136/263; 257/40; 257/461; 257/184
[58] Field of Search ................. 136/263; 357/8, 30 E, 357/30 J; 257/40, 461, 184

[56] References Cited

U.S. PATENT DOCUMENTS

| | | | |
|---|---|---|---|
| 4,105,470 | 8/1978 | Skotheim | 136/255 |
| 4,164,431 | 8/1979 | Tang | 136/263 |
| 4,281,053 | 7/1981 | Tang | 430/58 |
| 5,078,804 | 1/1992 | Chen et al. | 136/260 |

FOREIGN PATENT DOCUMENTS

61-202481 9/1986 Japan .................................. 136/263

*Primary Examiner*—Aaron Weisstuch
*Attorney, Agent, or Firm*—Oblon, Spivak, McClelland, Maier & Neustadt

[57] ABSTRACT

A photoelectric conversion device is composed of a first electrode and a second electrode, at least one of the electrodes being transparent; and a first organic material layer and a second organic material layer, which are overlaid between the first electrode and the second electrode in such a junction relationship that the first organic material layer and the second organic material layer constitute a rectifying junction, the first electrode and the first organic material layer constitute an ohmic junction, and when the first electrode comes into contact with the second organic material layer, the first electrode and the second organic material layer constitutes a rectifying junction, and the second electrode and the second organic material layer constitute an ohmic junction, and when the second electrode comes into contact with the first organic material layer, the second electrode and the first organic material layer constitute a rectifying junction. This photoelectric conversion device may further include an inorganic semiconductor layer between the first or second electrode and the first or second organic material layer when the inorganic semiconductor layer has the same junction relashionship with respect to the first or second electrode as mentioned above.

4 Claims, 5 Drawing Sheets

PHOTOELECTRIC CONVERSION DEVICE

FIELD OF THE INVENTION

This invention relates to a photoelectric conversion device which is suitable for use in photosensors and the like, and more particularly to a photoelectric conversion device of an organic/organic hetero junction type, comprising a first electrode and a second electrode, at least one of these electrodes being transparent, and a first organic material layer and a second organic material layer, which are overlaid between the first electrode and the second electrode.

DISCUSSION OF BACKGROUND

Varieties of photoelectric conversion devices using organic compounds as functional materials have been studied in order to develop an inexpensive and safe photoelectric conversion device, because it is extremely difficult to develop such an inexpensive and safe photoelectric device using a single crystalline silicon, a polycrystalline silicon or an amorphous silicon.

A photoelectric conversion device is a device for converting light energy to electrical energy (voltage × current). Therefore such a photoelectric conversion device is evaluated mostly with respect to its energy conversion efficiency. The presence of an inner electric field is necessary to generate a photo current. As devices for generating the photo current, MIS-type devices, hetero-pn-junction type devices comprising an n-type inorganic semiconductor and a p-type organic semiconductor, and hetero-pn-junction type devices comprising different types of organic semiconductors are known. It has been reported that the hetero-junction type devices comprising different types of organic semiconductors attain the highest energy conversion efficiency of the above photoelectric conversion devices.

As one group of organic compounds which form the junction, condensed polycyclic aromatic compounds, for instance, dyes such as Malachite Green, Methyl Violet and pyrylium compounds, flavanthrone, and perylene pigments are reported, and as another group of organic compounds which form the junction, phthalocyanine pigments and merocyanine dyes have been reported. Of the photoelectric conversion devices using these compounds, it is reported that a photoelectric conversion device with a structure of ITO/copper phthalocyanine/perylene pigment/Ag attains an energy conversion efficiency of 0.95% with AM-2 radiation at 75 mW/cm$^2$, which is the highest energy conversion efficiency (Voc=0.45 V, Jsc=2.3 mA/cm$^2$, ff=0.65) of those attained by devices using organic compounds (C. W. Tang *Appl. Phys. Lett*, 48, 183 (1986)). Japanese Patent Publication 62-4871 discloses a photoelectric conversion device with the same structure as that of the above photoelectric conversion device except that the perylene pigment employed therein is replaced by another perylene pigment, which attains an energy conversion efficiency of 1% (Voc=0.44 V, Jsc=3.0 mA/cm$^2$, ff=0.6).

Photoelectric conversion devices comprising organic compound layers have the advantages over other photoelectric conversion devices that illumination can be carried out through a transparent electrode and photo charges can be generated by two kinds of organic materials, so that the spectral sensitivity range can be broadened. The above-mentioned report by C. W. Tang indicates that electric charges are produced in a perylene pigment by the application of light with a wavelength of 450 to 550 nm, and in the copper phthalocyanine by the application of light with a wavelength of 550 to 700 nm. Further, the ff value of the above photoelectric conversion device is larger than those of other photoelectric conversion devices. It is considered from this fact that the inner electric field produced therein is also larger than those produced by other photoelectric conversion devices. In this sense, the photoelectric conversion device by Tang appears to be the most suitable one yet developed for use in practice. However, it is, in fact, still unsatisfactory for use in practice since the generation of the photo current must be further improved for practical use.

It is known that the photo current value can be increased by making the organic material layers in the photoelectric conversion device thinner. This is because the bulk resistances of the organic material layers are so large that an organic material layer which actually contributes to the generation of photo current, that is, the so-called photo active layer, must be made extremely thin in order to obtain a sufficient photo current for use in practice. However, when the organic material layer is made thin, pin holes are formed in the organic material layer and a short-circuit occurs within the device. Therefore the method of reducing the thickness of the organic material layer has not yet been made sufficiently practical in view of the yield of the photoelectric conversion device.

SUMMARY OF THE INVENTION

It is therefore an object of the present invention to provide a photoelectric conversion device of an organic/ organic hetero-junction type, which is free from the problem of the reduction of the performance thereof by a short-circuit within the device caused by the formation of pin holes in the organic material layers when the thicknesses of the organic material layers are reduced.

The above object of the present invention can be achieved by a photoelectric conversion device comprising a first electrode and a second electrode, at least one of these electrodes being transparent to light; and a first organic material layer and a second organic material layer, which are overlaid between the first electrode and the second electrode in such a configuration that the first organic material layer is in contact with the first electrode, and the second organic material layer is in contact with the second electrode, the first organic material layer is overlaid on the second organic material layer, the first organic material layer and the second organic material layer constitute a rectifying junction, the first electrode and the first organic material layer constitute an ohmic junction, and when the first electrode comes into contact with the second organic material layer, the first electrode and the second organic material layer constitute a rectifying junction, and the second electrode and the second organic material layer constitute an ohmic junction, and when the second electrode comes into contact with the first organic material layer, the second electrode and the first organic material layer constitute a rectifying junction.

In the above photoelectric conversion device, at least one of the first organic material layer or the second organic material layer may be composed of a plurality of organic material layers which constitute an ohmic junction.

The above object of the present invention can also be achieved by a photoelectric conversion device comprising a first electrode and a second electrode, at least one of these electrodes being transparent to light, an inorganic semiconductor layer, and a first organic material layer and a second organic material layer, which are overlaid in this order between the first electrode and the second electrode in such a configuration that the inorganic semiconductor layer is in contact with the first electrode, the first organic material layer is in contact with the inorganic semiconductor layer and with the second organic material layer, and the second organic material layer is in contact with the second electrode, and the inorganic semiconductor layer and the first organic material layer constitute an ohmic junction, the first organic material layer and the second organic material layer constitute a rectifying junction, and when the inorganic semiconductor layer comes into contact with the second organic material layer, the inorganic semiconductor layer and the second organic material layer constitute a rectifying junction, and the second electrode and the second organic material layer constitute an ohmic junction, and when the second electrode comes into contact with the first organic material layer, the second electrode and the first organic material layer constitute a rectifying junction.

In the above photoelectric conversion device, at least one of the first organic material layer or the second organic material layer may be composed of a plurality of organic material layers in an ohmic junction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
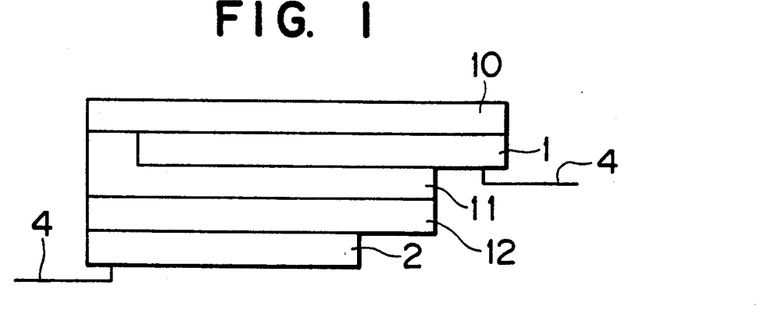
FIG. 1 is a schematic cross-sectional view of an example of a photoelectric conversion device according to the present invention.

Referring now to the drawings, wherein like reference numerals designate identical or corresponding parts throughout the several views, and more particularly to FIG. 1 thereof, FIG. 1 is a schematic cross-sectional view of an example of a photoelectric conversion device according to the present invention. In the figure, reference numeral 1 indicates a transparent electrode; reference numeral 2, a back electrode; reference numeral 11, a first organic material layer; reference numeral 12, a second organic material layer; reference numeral 4, a lead wire connected to the transparent electrode 1 or the back electrode 2; and reference numeral 10, a transparent insulating substrate.

In this photoelectric conversion device, the transparent electrode 1 and the first organic material layer 11 are in contact and constitute an ohmic junction, and the back electrode 2 and the second organic material layer 12 are also in contact and constitute an ohmic junction. When the transparent electrode 1 comes into contact with the second organic material layer 12, the transparent electrode 1 and the second organic material layer 12 constitute a rectifying junction. Furthermore, the first organic material layer 11 and the second organic material layer 12 constitute a rectifying junction by which a photo current is generated when the junction is irradiated.

In the photoelectric conversion device shown in FIG. 1, the transparent insulating layer 10 may be provided on the reverse side of the back electrode 2 opposite to the second organic material layer 12.

Furthermore, at least one of the first organic material layer 11 or the second organic material layer 12 may be composed of a plurality of overlaid organic material layers which constitute an ohmic junction. In this case, these overlaid organic material layers which constitute the first organic material layer 11 or the second organic material layer 12 function as a whole as one of the layer 11 or the layer 12.

Figure 2:
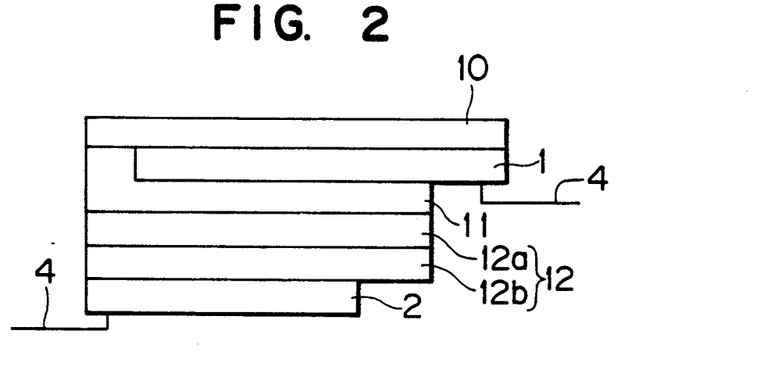
FIG. 2 is a schematic cross-sectional view of another example of the photoelectric conversion device according to the present invention.

FIG. 2 shows another example of the photoelectric conversion device according to the present invention with the same structure as that of the photoelectric conversion device shown in FIG. 1 except that the second organic material layer 12 consists of a second organic material layer 12a and a second organic material layer 12b.

In the photoelectric conversion device shown in FIG. 2, the transparent electrode 1 and the first organic material layer 11 constitute an ohmic junction. When the transparent electrode 1 comes into contact with the second organic material layer 12a or the second organic material layer 12b, the transparent electrode 1 and the second organic material layer 12a or the second organic material layer 12b constitute a rectifying junction. The back electrode 2 and the second organic material layer 12a or the second organic material layer 12b constitute an ohmic junction, and when the back electrode 2 comes into contact with the first organic material layer 11, the back electrode 2 and the first organic material layer 11 constitute a rectifying junction.

Figure 3:
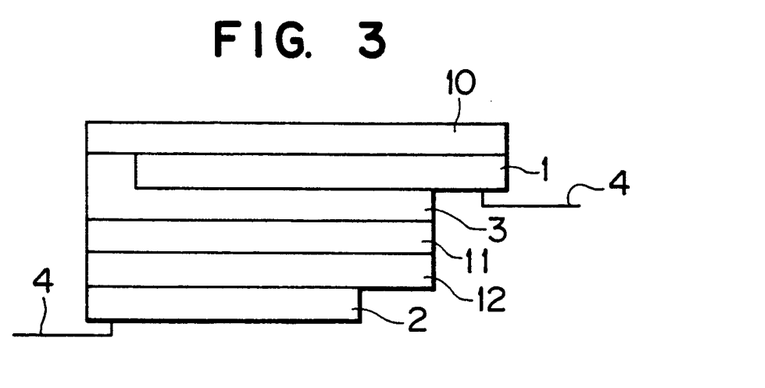
FIG. 3 is a schematic cross-sectional view of a further example of the photoelectric conversion device according to the present invention.

FIG. 3 shows a further example of the photoelectric conversion device according to the present invention with the same structure as that of the photoelectric conversion device shown in FIG. 1 except that a transparent inorganic semiconductor layer 3 is interposed between the transparent electrode 1 and the first organic material layer 11. The transparent inorganic semiconductor layer 3 may be interposed between the back electrode 2 and the second organic material layer 12. In this case, it is not always necessary that the semiconductor layer 3 be transparent.

In the photoelectric conversion device as shown in FIG. 3, the transparent inorganic semiconductor layer 3 and the first organic material layer 11 constitute an ohmic junction. When the transparent inorganic semiconductor layer 3 comes into contact with the second organic material layer 12, the transparent inorganic semiconductor layer 3 and the second organic material layer 12 constitute a rectifying junction. The back electrode 2 and the second organic material layer 12 constitute an ohmic junction, and when the back electrode 2 comes into contact with the first organic material layer 11, the back electrode 2 and the first organic material layer 11 constitute a rectifying junction. Furthermore, at least one of the first organic material layer 11 or the second organic material layer 12 may be composed of a plurality of overlaid organic material layers which constitute an ohmic junction.

In the photoelectric conversion device according to the present invention, even when the organic material layers are made thin, a short-circuit within the device can be avoided so that the efficiency of the generation of photo current can be significantly improved. The reasons for this are considered to be as follows:

In the photoelectric conversion device according to the present invention, electric charges are generated when light is applied to the photoelectric conversion device because of the rectifying junction between the first organic material layer and the second organic material layer. For example, it is supposed that the first organic material layer 11 is an n-type layer and the second organic material layer 12 is a p-type layer in the photoelectric conversion device shown in FIG. 1. Positive holes generated by the application of light pass through the organic material layer 12 and reach the back electrode 2, while electrons generated by the application of light pass through the first organic material layer 11 and reach the transparent electrode 1. Since the contact between the transparent electrode 1 and the first organic material layer 11 and that between the back electrode 2 and the second organic material layer 12 are in an ohmic junction, the generated electric charges are not hindered by a potential barrier during the course of the transfer thereof. Furthermore it is known that those organic material layers should be made thin as much as possible in order to obtain a high photo current because the organic material layers have a high bulk resistance or because a photo-active layer which is effective for the generation of electric charges is extremely thin. Generally there is a tendency that the generation of the photo current is increased even when the thickness of the organic material layers is reduced to 500 Å or less.

However, when the organic material layers have a thickness of 500 Å or less, a short-circuit occurs within the device to an extent such that the occurrence thereof cannot be ignored. The short-circuit occurs because of the pin holes in the organic material layers. However the formation of the pin holes is considered inevitable in the organic material layers with a thickness of 500 Å or less even when the methods and conditions for the formation of the organic material layers are modified.

According to the present invention, however, even when pin holes are formed in the first organic material layer 11 and the transparent electrode 1 comes into direct contact with the second organic material layer 12, a rectifying junction is formed at the interface between the transparent electrode 1 and the second organic material layer 12. When light is applied to the interface, positive holes passes through the second organic material layer 12 so that a photo current which reaches the back electrode 2 is generated. The direction of this photo current is exactly the same as that of a photo current which is generated when no pin holes are formed in the first organic material layer 11. Therefore the performance of the photoelectric conversion device is not impaired by the pin holes in the first organic material layer 11. Even when light does not reach the interface between the transparent electrode 1 and the second organic material layer 12, since transparent electrode 1 and the second organic material layer 12 constitute a rectifying junction, substantially no positive holes flow from the second organic material layer 12 to the transparent electrode 1 until the potential is raised to some extent. However, if the second organic material layer 12 and the transparent electrode 1 constitute an ohmic junction, the photo current is not generated, and a leakage current is generated in the direction opposite to the direction of the photo current through the ohmic portion by the photo-induced voltage generated by irradiation. As a result, the photo current and the photo-induced voltage are cancelled by the leakage current, so that the performance of the photoelectric conversion device is significantly impaired. The above-mentioned advantages of the photoelectric conversion device according to the present invention over the conventional devices can also be obtained in the same manner as mentioned above even when pin holes are present in the second organic material layer 12.

As the materials for the transparent insulating substrate 10 for use in the photocurrent conversion device according to the present invention, for example, glass and plastic films can be employed.

As the materials for the transparent electrode 1 for use in the photocurrent conversion device according to the present invention, for example, indium tin oxide (ITO), tin oxide, and indium oxide can be employed. It is preferable that the thickness of the transparent electrode 1 be in the range of 100 Å to 10,000 Å.

As the materials for the back electrode 2 for use in the photocurrent conversion device according to the present invention, for example, Au, Pt, Ni, Pd, Cr and Ta (Group A) and In, Al, Pb, Zn, Mg, Ag and Cu (Group B) can be employed. The back electrode 2 can be formed by vacuum deposition or sputtering of these metals or by using a plate made of any of the above metals. It is preferable that thickness of the back electrode 2 be in the range of 50 Å to 10,000 Å when the back electrode 2 is formed by vacuum deposition or sputtering.

As the materials for the inorganic semiconductor layer 3 for use in the photocurrent conversion device according to the present invention, for example, ZnO, CdS, $TiO_2$, and P-doped amorphous silicon can be employed as an n-type semiconductor layer, and $Cu_2S$, PbS, CdTe, and B-doped amorphous silicon can be employed as a p-type semiconductor layer. It is preferable that thickness of the inorganic semiconductor layer 3 be in the range of 10 Å to 10,000 Å.

Examples of organic materials having electron-accepting properties for use in the organic material layers 11 and 12 are as follows:

Perylene pigments such as Pigment Red (hereinafter referred to as PR) PR179, PR190, PR149, PR189, PR123, and Pigment Brown 26; perinone pigments such as Pigment Orange 43, and PR194; anthraquinone pigments such as PR168, PR177, and Vat Yellow 4; quinone-containing yellow pigments such as flavanthrone; dyes such as Crystal Violet, Methyl Violet, and Malachite Green; and acceptor compounds such as fluorenone, 2,4,7-trinitrofluorenone, tetracyanoquinodimethane, and tetracyanoethylene.

The vacuum deposition method, the spin coating method and the dipping method are suitable for obtaining uniformly thin organic material layers using these materials.

Examples of organic materials having electron-donating properties for use in the organic material layers 11 and 12 are as follows:

(1) Phthalocyanine pigments, for example, phthalocyanines with the central metal thereof being a divalent metal such as Cu, Zn, Co, Ni, Pb, Pt, Fe, or Mg; metal-free phthalocyanines; halogen-coordinated phthalocyanines with the central metal thereof being a trivalent metal such as aluminum chloro phthalocyanine, indium chloro phthalocyanine, and gallium chloro phthalocyanine; and oxygen-coordinated phthalocyanines such as vanadyl phthalocyanine, and titanyl phthalocyanine;

(2) Indigo and thioindigo pigments such as Pigment Blue 66, and Pigment Violet 36;

(3) Quinacridone pigments such as Pigment Violet 19, and Pigment Red 122;

(4) Dyes such as merocyanine compounds, cyanin compounds, and squarylium compounds;

(5) Charge transfer agents for use in organic electrophotographic photoconductors, such as hydrazone compounds, pyrazoline compounds, triphenylmethane compounds, and triphenylamine compounds;

(6) Compounds having electron-donating properties used in electroconductive organic electron-transfer complexes such as tetrathiofluvalene, and tetraphenyltetrathiofluvalene; and (7) Electroconductive polymers such as polypyrrole, polythiophene, and polyaniline.

The organic material layer using any of the above electro-donating materials can prepared by the vacuum deposition method, the spin coating method, the dipping method or the electrochemical polymerization method. Of these methods, the vacuum deposition method is most suitable for obtaining uniformly thin organic material layers.

The organic material layer having electron-accepting properties (hereinafter referred to as the electron-accepting organic material layer) constitutes (i) an ohmic junction in contact with each of the transparent electrode, the n-type inorganic semiconductor layer, and the back electrode comprising a material which belongs to the previously mentioned group B (hereinafter referred to as the group-B back electrode), and (ii) a rectifying junction in contact with each of the p-type inorganic semiconductor layer, and the back electrode comprising a material which belongs to the previously mentioned group A (hereinafter referred to as the group-A back electrode).

Therefore, in a photoelectric conversion device according to the present invention, the electron-accepting organic material layer is in direct contact with the transparent electrode, the n-type inorganic semiconductor layer, or the group-B back electrode, and is overlaid on the p-type inorganic semiconductor layer or the group-A back electrode via the electron-donating organic layer.

The organic material layer having electron-donating properties (hereinafter referred to as the electron-donating organic material layer) constitutes (i) an ohmic junction in contact with each of the transparent electrode, the p-type inorganic semiconductor layer, and the group-A back electrode, and (ii) a rectifying junction in contact with each of the n-type inorganic semiconductor layer, and the group-B back electrode.

Therefore, in another photoelectric conversion device according to the present invention, the electron-donating organic material layer is in direct contact with the transparent electrode, the p-type inorganic semiconductor layer, or the group-A back electrode, and is overlaid on the n-type inorganic semiconductor layer or the group-B back electrode via the electron-accepting organic layer.

Examples of the combination of the organic materials for the overlaid organic material layers in the present invention, particularly in the case where two organic material layers are overlaid, include perylene pigment/phthalocyanine pigment, perinone pigment/phthalocyanine pigment; anthraquinone pigment/phthalocyanine pigment; perylene pigment/quinacridone pigment; and perylene pigment/merocyanine compound.

When three organic material layers are overlaid, examples of the combination of the organic materials include perylene pigment/phthalocyanine pigment/quinacridone pigment; perylene pigment/cyanine compound/quinacridone pigment; perylene pigment/squarylium compound/quinacridone pigment; perylene pigment/phthalocyanine pigment/charge transfer agent; perinone pigment/phthalocyanine pigment/quinacridone pigment; and anthraquinone pigment/phthalocyanine pigment/quinacridone pigment.

Examples of preferable combinations of electron-accepting organic compounds for use in the second organic material layer 12a and the second organic material layer 12b as shonw in FIG. 2 include perylene pigment (450 to 600 nm)/perinone pigment (400 to 550 nm); perylene pigment/flavanthrone (400 to 550 nm); perylene pigment/acceptor compound (400 to 500 nm); perinone pigment/acceptor compound; Crystal Violet (500 to 650 nm)/perylene pigment; and anthraquinone pigment (450 to 600 nm)/acceptor compound. The figures in the parentheses indicate the main spectral absorption band in the visible light range.

Examples of preferable combination of electron-donating organic compounds for use in the second organic material layer 12a and the second organic material layer 12b as shown in FIG. 2 include phthalocyanine pigment/quinacridone pigment; squarylium compound/quinacridone pigment; phthalocyanine pigment/charge transfer agent; phthalocyanine pigment/electron-donating compound; phthalocyanine pigment/electroconductive polymer; merocyanine compound/charge transfer agent; merocyanine compound/electron-donating compound; squarylium compound/charge transfer agent; and quinacrydone pigment/charge transfer agent.

It is preferable that each of the organic material layers have a thickness of 30 Å to 3000 Å since even when the organic material layer is thicker than 3000 Å, the Jsc value does not increase, and when the organic material layer is thinner than 30 Å, there is the tendency that the light absorption of the organic material layer itself decreases so that the Jsc value also decreases.

The features of this invention will become apparent in the course of the following description of exemplary embodiments, which are given for illustration of the invention and are not intended to be limiting thereof.

EXAMPLE 1

An zinc oxide layer having a thickness of 1500 Å, a perylene tetracarboxylic acid bismethyl imide (PL-ME) layer with a thickness of 200 to 1500 Å, an aluminum chloro phthalocyanine (AlClPc) layer with a thickness of about 700 Å were successively deposited on a clean ITO glass plate (made by Matsuzaki Shinku Co., Ltd.) with a resistivity of 30 $\Omega/\square$ serving as a substrate by the DC magnetron sputtering method under the conditions that the substrate temperature was set at about 300° C. and argon gas was employed as an introduction gas.

An Au layer was deposited on the uppermost organic layer by vacuum deposition in such a manner that the correspondingly area overlapped by the ITO layer on the glass substrate and the Au layer was 0.25 cm$^2$. A lead wire was attached by a silver paste to each of the two electrodes, that is, the ITO layer and the Au layer, whereby 12 photoelectric conversion devices according to the present invention were fabricated, with 2 photoelectric conversion devices for each PL-ME layer with the same thickness. The specific thickness of the PL-ME layer of each photoelectric conversion device is indicated in FIG. 4.

Additional photoelectric conversion devices according to the present invention were fabricated in the same manner as mentioned above except that the thickness of the PL-ME layer was set at about 650 Å and the thickness of the AlClPc layer changed from about 300 Å to 1500 Å, with 2 photoelectric conversion devices for each AlClPc layer with the same thickness. The specific thickness of the AlClPc layer of each photoelectric conversion device is indicated in FIG. 5.

A white light beam with 75 mW/cm$^2$ was applied to the ITO layer side of these photoelectric conversion devices, with sweeping application of a voltage of 6 mV/s to the Au electrode layer to obtain an I-V curve and to estimate the conversion efficiency thereof.

Figure 4:
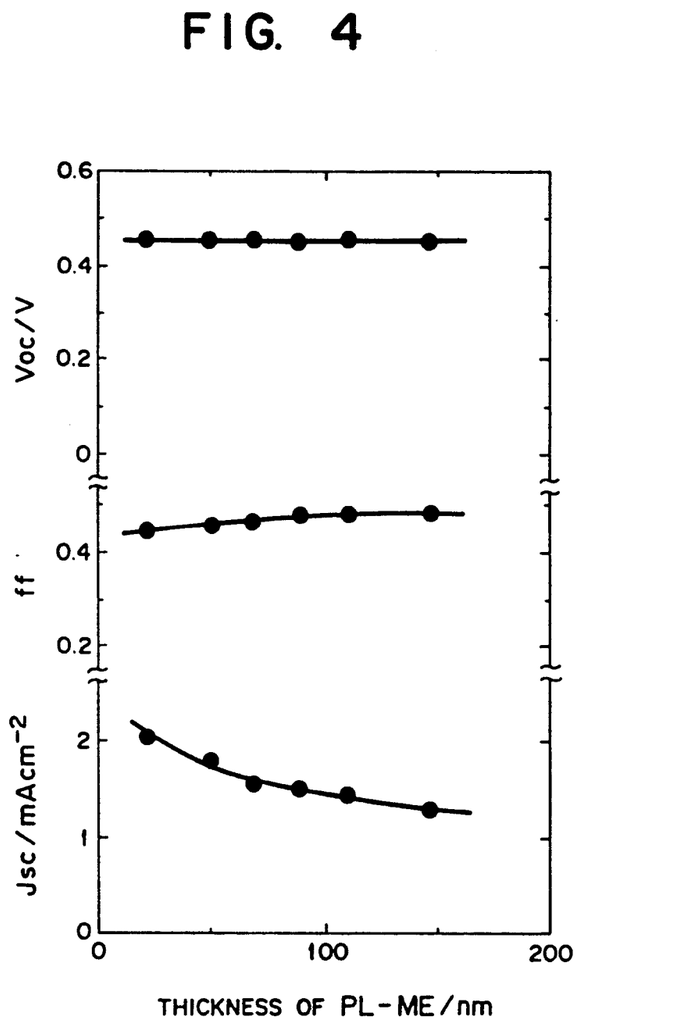
FIG. 4 is a graph showing the changes in the photoelectric conversion characteristics when the thickness of a PL-ME layer of the photoelectric conversion device fabricated in Example 1 according to the present invention was changed.
Figure 5:
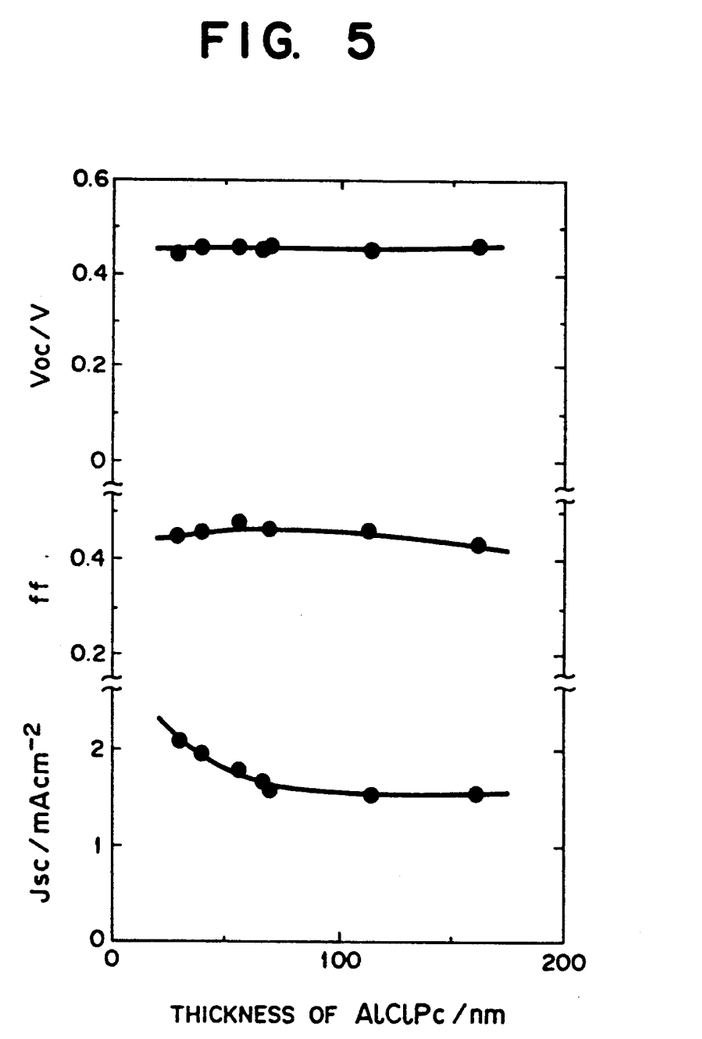
FIG. 5 is a graph showing the changes in the photoelectric conversion characteristics when the thickness of an AlClPc layer of the photoelectric conversion device fabricated in Example 1 according to the present invention was changed.

The photoelectric conversion devices including the about 700 Å thick AlClPc layer and the photoelectric conversion devices including the about 650 Å thick PL-ME layer yielded a Voc value of 0.4 V or more, an ff value of 0.4 or more, and a Jsc value of 1.5 mA/cm$^2$ or more, as respectively shown in FIG. 4 and FIG. 5. These values are relatively large for photoelectric conversion devices using organic material layers. Of these 24 photoelectric conversion devices, only two devices had a Voc value of less than 0.4 V, indicating the occurrence of short-circuits in the devices.

Figure 6:
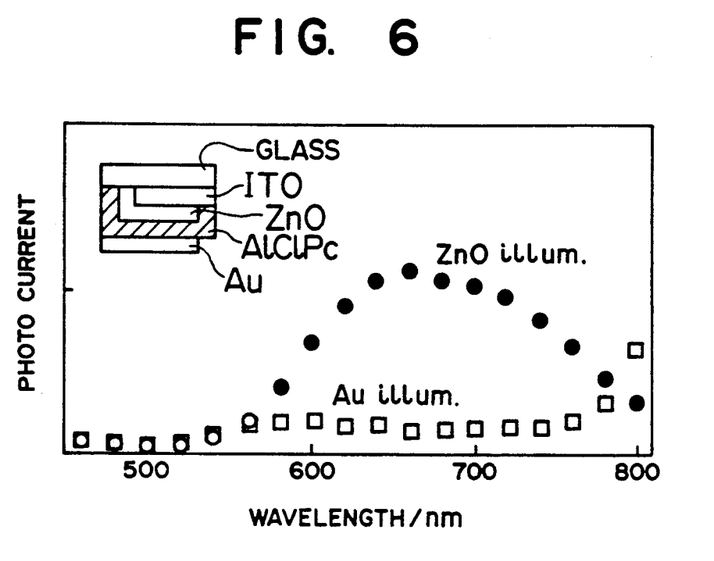
FIG. 6 is a diagram showing the relationship between (i) the wavelength of a light incident to the organic material layer of the photoelectric conversion device in Example 1 from which the PL-ME layer is removed and (ii) the photo current spectrum thereof.
Figure 7:
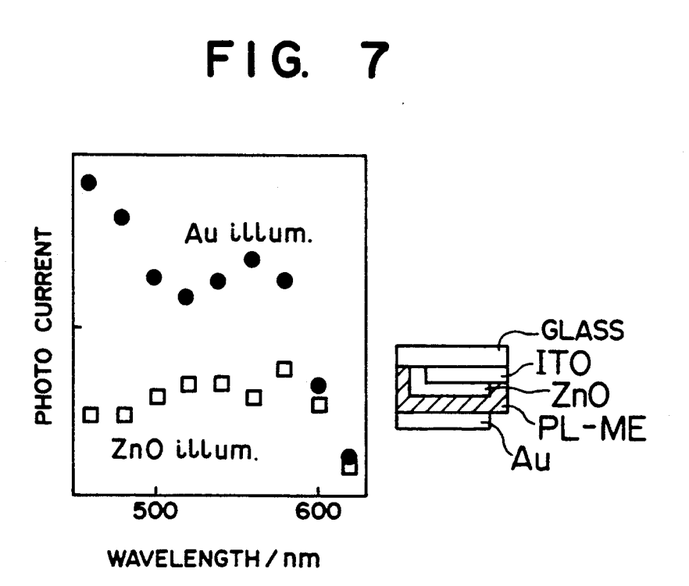
FIG. 7 is a diagram showing the relationship between (i) the wavelength of a light incident to the organic material layer of the photoelectric conversion device in Example 1 from which the AlClPc layer is removed and (ii) the photo current spectrum thereof.
Figure 8:
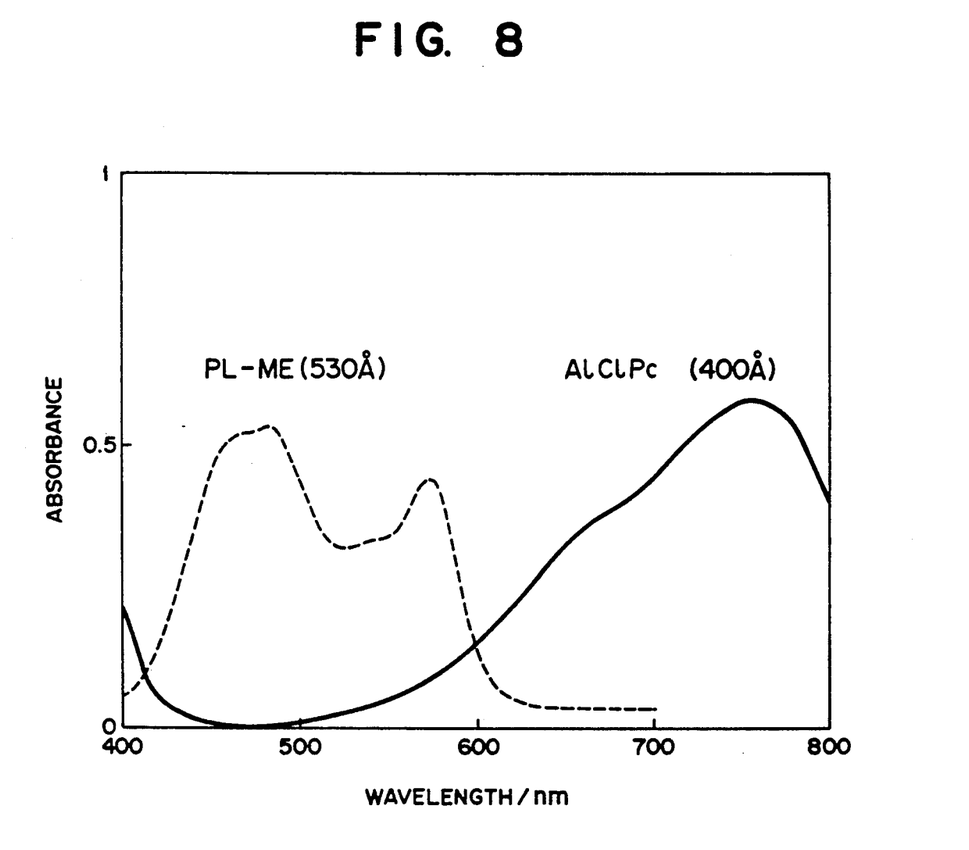
FIG. 8 is a diagram showing the absorbance spectra of a PL-ME deposited layer with a thickness of 530 Å and an AlClPc deposited layer with a thickness of 400 Å of a photoelectric conversion device fabricated in Example 1.

A photoelectric conversion device with a structure of ITO/ZnO/AlClPc/Au, without including the PL-ME layer, and a photoelectric conversion device with a structure of ITO/ZnO/PL-ME/Au, without including the AlClPc layer, were fabricated in order to check the junction state in the photoelectric conversion devices according to the present invention by comparing the photo current spectra thereof and the absorbance spectra of the respective organic material layers as shown in FIG. 8. As a result, it has been confirmed that the charge generation site during illumination of the former photoelectric conversion device is the ZnO/AlClPc interface as shown in FIG. 6, and the charge generation site during illumination of the latter photoelectric conversion device is the Au/PL-ME interface as shown in FIG. 7, and both photoelectric conversion devices exhibited rectifying performance in the current-voltage characteristics in the dark.

The analysis of the above photoelectric conversion devices indicate that the ZnO/PL-ME contact and the AlClPc/Au contact in the photoelectric conversion devices according to the present invention constitute an ohmic junction, and the ZnO/AlClPc contact and the PL-ME/Au contact, if these contacts actually occur, constitute a rectifying junction.

COMPARATIVE EXAMPLE 1

The procedure for Example 1 was repeated except that the ZnO layer was not provided in each photoelectric conversion device and 4 photoelectric conversion devices for each PL-ME layer with the same thickness, and 4 photoelectric conversion devices for each AlClPc layer with the same thickness were fabricated, so that 48 comparative photoelectric conversion devices were fabricated.

The photoelectric conversion characteristics of these comparative photoelectric conversion devices were estimated in the same manner as in Example 1. As a result, it was confirmed that the Voc values of most of these comparative photoelectric conversion devices were smaller than those of the photoelectric conversion devices fabricated in Example 1, and adverse effects by the occurrence of short-circuits in the devices were observed. Only two comparative photoelectric conversion devices with a Voc value of 0.4 V or more were found. 18 comparative photoelectric conversion devices had a value of Voc of 0.1V or less, which occupied 37.5% of the entire comparative photoelectric conversion devices.

The junction state of the comparative photoelectric conversion device with the structure of ITO/AlClPc/Au was investigated in the same manner as in Example 1. The result was that the ITO/AlClPc contact constituted an ohmic junction.

EXAMPLE 2

1.34 g of CdCl$_2$ and 0.47 g of sulfur were dissolved in 159 g of dimethyl sulfoxide at 110° C. In this solution, an ITO glass and a counter electrode Pt were immersed, and a constant current of 1.6 mA/cm$^2$ was caused to flow through the ITO layer of the ITO glass, whereby a CdS film layer with a thickness of about 1000 Å was formed on the ITO glass. A PL-ME layer with a thickness of about 500 Å, an AlClPc layer with a thickness of about 400 Å, and an Au layer were successively overlaid by vacuum deposition on the CdS film layer provided on the ITO glass, whereby a photoelectric conversion device according to the present invention was fabricated.

The photoelectric conversion characteristics of this photoelectric conversion device were measured in the same manner as in Example 1. The result was that Voc=0.43 V, ff=0.42, and Jsc=1.98 mA/cm$^2$, which indicate that there were no short circuit problems.

Six photoelectric conversion devices were fabricated in accordance with the above-mentioned procedure in this example and the photoelectric conversion characteristics thereof were measured in the same manner as in Example 1. The result was that of the six photoelectric conversion devices, two photoelectric conversion devices had a Voc value of less than 0.4 V, indicating that the probability of the occurrence of a short circuit in this Example is much less than that in Comparative Example 1.

The junction state of this photoelectric conversion device was investigated in the same manner as in Example 1 by fabricating a photoelectric conversion device with the provision of the AlClPc layer directly on the CdS layer. As a result, it was confirmed that the CdS/AlClPc contact constituted a rectifying junction.

EXAMPLE 3

The procedure for Example 1 was repeated except that the thickness of the PL-ME layer employed in Example 1 was changed to 500 Å, and the AlClPc employed in Example 1 was replaced by a 2,9-dimethyl-quinacridone (QA-ME) with a thickness of 500 Å, whereby a photoelectric conversion device according to the present invention was fabricated.

The photoelectric conversion characteristics of this photoelectric conversion device were estimated in the same manner as in Example 1. The result was that Voc=0.49 V, ff=0.59, and Jsc=0.68 mA/cm$^2$.

Four photoelectric conversion devices were fabricated in accordance with the above-mentioned procedure in this Example and the Voc values thereof were measured in the same manner as in Example 1. The result was that the Voc values of all the photoelectric conversion devices were more than 0.45 V and these photoelectric conversion devices were free from the short circuit problem.

The junction state of this photoelectric conversion device was investigated in the same manner as in Example 1. As a result, it was confirmed that the QA-ME/Au contact constituted an ohmic junction, and the QA-ME/ZnO contact constituted a rectifying junction.

COMPARATIVE EXAMPLE 2

Four comparative photoelectric conversion devices were fabricated in the same manner as in Example 3 except that the ZnO layer was not provided in each photoelectric conversion device. The values of the Voc of these comparative photoelectric conversion devices were measured in the same manner as in Example 1. The result was that three photoelectric conversion devices had a value of Voc of less than 0.2 V out of the four photoelectric conversion devices, which indicate that the probability of the occurrence of a short circuit was extremely high.

The junction state of these comparative photoelectric conversion devices was investigated in the same manner as in Example 1. As a result, it was confirmed that the QA-ME/ITO contact constituted an ohmic junction.

EXAMPLE 4

An Au layer with a thickness of about 200 Å was deposited on a glass substrate by vacuum deposition to prepare a translucent illumination electrode. A TiOPc layer with a thickness of about 500 Å, a PL-ME layer with a thickness of about 500 Å, and a Mg layer were successively overlaid on the Au layer formed on the glass substrate, whereby a photoelectric conversion device according to the present invention was fabricated.

The photoelectric conversion characteristics of this photoelectric conversion device were estimated in the same manner as in Example 1. The result was that Voc=0.38 V, which is relatively high.

Four photoelectric conversion devices were fabricated in accordance with the above-mentioned procedure in this example and the values of the Voc thereof were measured in the same manner as in Example 1. The result was that the Voc values of all the photoelectric conversion devices were such that these photoelectric conversion devices were free from the short circuit problem.

The junction state of this photoelectric conversion device was investigated in the same manner as in Example 1. As a result, it was confirmed that the PL-ME/Mg contact and the Au/TiOPc contact constituted an ohmic junction, and the TiOPc/Mg contact constituted a rectifying junction.

EXAMPLE 5

A PL-ME layer with a thickness of 300 Å, an AlClPc layer with a thickness of 120 Å, and a QA-ME layer with a thickness of about 300 Å were successively on the same ZnO layer as employed in Example 1 in the same manner as in Example 1, and then an Au layer was deposited in vacuum, whereby a photoelectric conversion device according to the present invention was fabricated.

The photoelectric conversion characteristics of this photoelectric conversion device were estimated in the same manner as in Example 1. The result was that Voc=0.48 V, ff=0.49, and Jsc=3.5 mA/cm$^2$.

Four photoelectric conversion devices were fabricated in accordance with the above-mentioned procedure in this example and the Voc value thereof were measured in the same manner as in Example 1. The result was that the Voc values of all the photoelectric conversion devices were more than 0.45 V and these photoelectric conversion devices were free from the short circuit problem.

What is claimed is:

1. A photoelectric conversion device comprising:
    a first electrode and a second electrode, at least one of said first and second electrodes being transparent; and
    a first organic material layer and a second organic material layer, which are overlaid between said first electrode and said second electrode in such a configuration that said first organic material layer is in contact with said first electrode, and said second organic material layer is in contact with said second electrode, said first organic material layer is overlaid on said second organic material layer, said first organic material layer and said second organic material layer constitute a rectifying junction, said first electrode and said first organic material layer constitute and ohmic junction, and when said first electrode comes into contact with said second organic material layer, said first electrode and said second organic material layer constitutes a rectifying junction, and said second electrode and said second organic material layer constitute an ohmic junction, and when said second electrode comes into contact with said first organic material layer, said second electrode and said first organic material layer constitute a rectifying junction.

2. The photoelectric conversion device as claimed in claim 1, wherein at least one of said first organic material layer or said second organic material layer is composed of a plurality of organic material layers which constitute an ohmic junction with each other.

3. A photoelectric conversion device comprising:
a first electrode and a second electrode, at least one of said electrodes being transparent; and
an inorganic semiconductor layer, and a first organic material layer and a second organic material layer, which are overlaid in this order between said first electrode and said second electrode in such a configuration that the inorganic semiconductor layer is in contact with said first electrode, said first organic material layer is in contact with said inorganic semiconductor layer and with said second organic material layer, and said second organic material layer is in contact with said second electrode, and said inorganic semiconductor layer and said first organic material layer constitute an ohmic junction, said first organic material layer and said second organic material layer constitute a rectifying junction, and when said inorganic semiconductor layer comes into contact with said second organic material layer, said inorganic semiconductor layer and said second organic material layer constitute a rectifying junction, and said second electrode and said second organic material layer constitute an ohmic junction, and when said second electrode comes into contact with said first organic material layer, said second electrode and said first organic material layer constitute a rectifying junction.

4. The photoelectric conversion device as claimed in claim 3, wherein at least one of said first organic material layer or said second organic material layer comprises a plurality of organic material layers which constitute an ohmic junction.

* * * * *

UNITED STATES PATENT AND TRADEMARK OFFICE
CERTIFICATE OF CORRECTION

PATENT NO. : 5,264,048
DATED : November 23, 1993
INVENTOR(S) : Masao Yoshikawa, et. al.

It is certified that error appears in the above-indentified patent and that said Letters Patent is hereby corrected as shown below:

Title page, item [57], Abstract, third line from bottom, "the same junction relashionship" should read --the same junction relationship--
Column 9, line 14, "An zinc oxide" should read -- A zinc oxide--

Signed and Sealed this

Third Day of January, 1995

Attest:

BRUCE LEHMAN

Attesting Officer

Commissioner of Patents and Trademarks